US010985025B2

(12) United States Patent
Miller et al.

(10) Patent No.: US 10,985,025 B2
(45) Date of Patent: Apr. 20, 2021

(54) FIN CUT PROFILE USING FIN BASE LINER

(71) Applicant: INTERNATIONAL BUSINESS MACHINES CORPORATION, Armonk, NY (US)

(72) Inventors: Eric R. Miller, Watervliet, NY (US); Stuart A. Sieg, Albany, NY (US); Yann Mignot, Slingerlands, NY (US); Indira Seshadri, Niskayuna, NY (US); Christopher J. Waskiewicz, Rexford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/173,331

(22) Filed: Oct. 29, 2018

(65) Prior Publication Data

US 2020/0135484 A1  Apr. 30, 2020

(51) Int. Cl.
*H01L 21/308* (2006.01)
*H01L 21/8234* (2006.01)
*H01L 21/033* (2006.01)
*H01L 29/66* (2006.01)

(52) U.S. Cl.
CPC ...... *H01L 21/3086* (2013.01); *H01L 21/3085* (2013.01); *H01L 21/823431* (2013.01)

(58) Field of Classification Search
None
See application file for complete search history.

(56) References Cited

U.S. PATENT DOCUMENTS

| | | | |
|---|---|---|---|
| 7,732,341 B2* | 6/2010 | Koh | H01L 21/0337 |
| | | | 257/E21.026 |
| 8,658,536 B1 | 2/2014 | Choi et al. | |
| 8,703,557 B1 | 4/2014 | Cai et al. | |
| 9,147,730 B2 | 9/2015 | Xie et al. | |
| 9,425,106 B1 | 8/2016 | Xie et al. | |
| 9,496,371 B1* | 11/2016 | Arndt | H01L 21/3081 |
| 9,741,823 B1 | 8/2017 | Greene et al. | |
| 9,761,450 B1* | 9/2017 | Bi | H01L 21/823431 |
| 9,847,418 B1 | 12/2017 | Lim et al. | |
| 10,002,795 B1 | 6/2018 | Bi et al. | |
| 2015/0145065 A1 | 5/2015 | Kanakasabapathy et al. | |
| 2016/0322461 A1* | 11/2016 | Chan | H01L 29/0649 |
| 2017/0358660 A1 | 12/2017 | Cheng et al. | |
| 2018/0069113 A1 | 3/2018 | Cheng et al. | |

\* cited by examiner

*Primary Examiner* — Stephanie P Duclair
(74) *Attorney, Agent, or Firm* — Tutunjian & Bitetto, P.C.; Abdy Raissinia (57) ABSTRACT

Methods for forming semiconductor fins include forming a protective layer around a base of a hardmask fin on an underlying semiconductor layer. A portion of the hardmask fin is etched away with an etch that is selective to the protective layer. A semiconductor fin is etched from the semiconductor layer using the etched hardmask fin as a mask.

20 Claims, 5 Drawing Sheets

FIN CUT PROFILE USING FIN BASE LINER

BACKGROUND

Technical Field

The present invention generally relates to semiconductor device fabrication and, more particularly, to fabrication processes that improve fin length uniformity by providing consistent hardmask profiles.

Description of the Related Art

There are a variety of techniques for forming fins from a semiconductor layer. In general, however, these techniques all involve the formation a mask that is used to define the fin position and dimensions, followed by an anisotropic etch into the semiconductor around the mask. The formation of the mask itself poses its own challenges, particularly in cutting mask fins to a consistent size. Inconsistent mask sizes, for example resulting from an imperfect etch that leaves sloped mask walls, result in a lack of uniformity in the semiconductor fins that are created. This fin length variation results in variances in finished device properties and can result in fabrication errors that decrease manufacturing yield.

SUMMARY

A method for forming a semiconductor fin includes forming a protective layer around a base of a hardmask fin on an underlying semiconductor layer. A portion of the hardmask fin is etched away with an etch that is selective to the protective layer. A semiconductor fin is etched from the semiconductor layer using the etched hardmask fin as a mask.

A method for forming semiconductor fins includes forming a protective layer around a base of hardmask fins on an underlying semiconductor layer and on a top surface of the underlying semiconductor layer, between the hardmask fins. A mask is formed over the hardmask fin that leaves a portion of the hardmask fin exposed. The exposed portion of the hardmask fin is anisotropically etched away with an etch that is selective to the protective layer, leaving a remaining portion of the hardmask fin with substantially vertical sidewalls. The mask is etched away. Semiconductor fins are etched from the semiconductor layer using the etched hardmask fins as a mask.

A method for forming semiconductor fins includes forming a protective hafnium oxide layer around bases of hardmask fins on an underlying semiconductor layer and on a top surface of the underlying semiconductor layer, between the hardmask fins, having a vertical portion on sidewalls of the hardmask fins. A mask is formed over the hardmask fins that leaves a portion of the hardmask fins exposed. The exposed portion of the hardmask fins is anisotropically etched away with an etch that is selective to the hafnium oxide layer leaving a remaining portion of the hardmask fin with substantially vertical sidewalls. The mask is etched away. Semiconductor fins are etched from the semiconductor layer using the etched hardmask fin as a mask.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide semiconductor devices that have superior fin length uniformity. This is accomplished by forming a protective liner at the base of the hardmask fins before cutting the hardmask fins to size. The protective liner enables the use of an etch chemistry that provides a superior hardmask fin profile without risking damage to the underlying semiconductor substrate.

Figure 1:
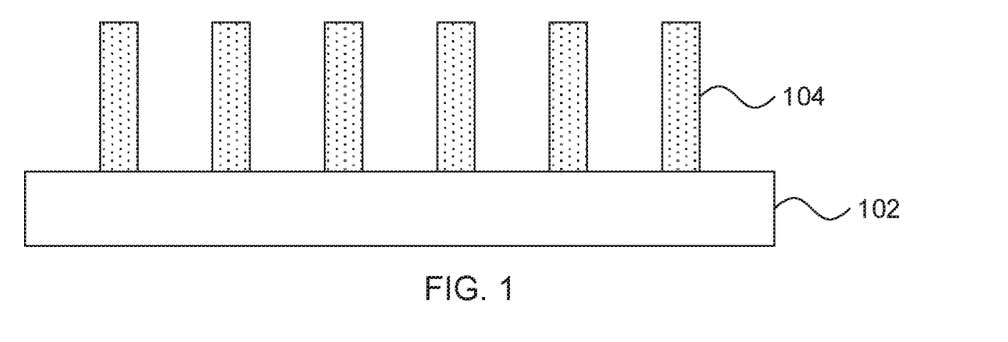
FIG. 1 is a cross-sectional diagram of a step in the formation of fin structures that shows the formation of hardmask fins on a semiconductor layer in accordance with an embodiment of the present invention.

Referring now to the drawings in which like numerals represent the same or similar elements and initially to FIG. 1, a cross-sectional view of a step in the formation of a set of semiconductor fins having sharp fin profiles is shown. A set of hardmask fins 104 is formed on a semiconductor layer 102. The composition of the hardmask fins 104 is shown herein as being a single layer of dielectric material, such as silicon nitride, but it should be understood that other compositions are contemplated, in particular fins formed from alternating layers of silicon oxide and silicon nitride. The hardmask fins 104 can be formed by any appropriate anisotropic etch such as, e.g., a reactive ion etch (RIE).

The semiconductor layer 102 may be a bulk-semiconductor substrate. Although the semiconductor layer 102 is shown herein as being relatively thin, it should be understood that the bulk of the semiconductor layer thickness is not shown unless needed in the interest of compact depiction. In one example, a bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multilayers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor layer 102 may also be a semiconductor on insulator (SOI) substrate. In other embodiments, the semiconductor layer 102 may be formed from a multi-layer structure of different semiconductor layers, for example alternating layers of a channel material and layers of a sacrificial material.

Figure 2:
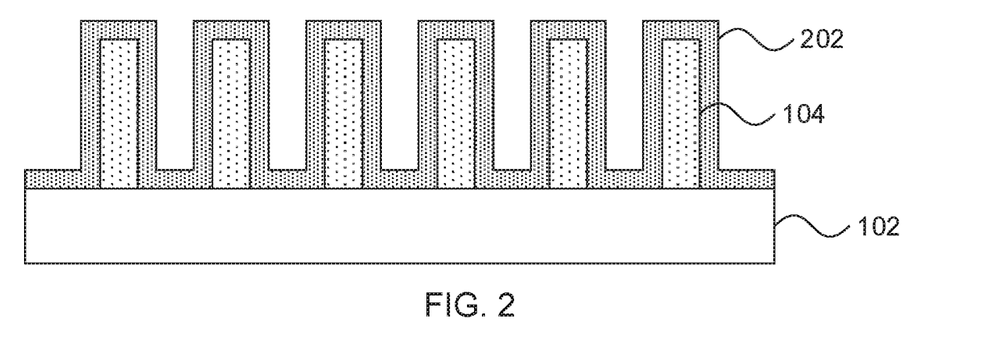
FIG. 2 is a cross-sectional diagram of a step in the formation of fin structures that shows the formation of a first selectively etchable layer on the hardmask fins in accordance with an embodiment of the present invention.

Referring now to FIG. 2, a cross-sectional view of a step in the formation of a set of semiconductor fins having sharp fin profiles is shown. A layer of protective material 202 is formed over the hardmask fins 104 by any appropriate conformal deposition process such as, e.g., chemical vapor deposition (CVD), atomic layer deposition (ALD), or physical vapor deposition (PVD). It is specifically contemplated that the protective material may be formed from a hafnium oxide, but it should be understood that any appropriate material may be selected if it has etch selectivity relative to the material of the hardmask fins 104. As used herein, the term "selective" in reference to a material removal process denotes that the rate of material removal for a first material is greater than the rate of removal for at least another material of the structure to which the material removal process is being applied.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface.

Figure 3:
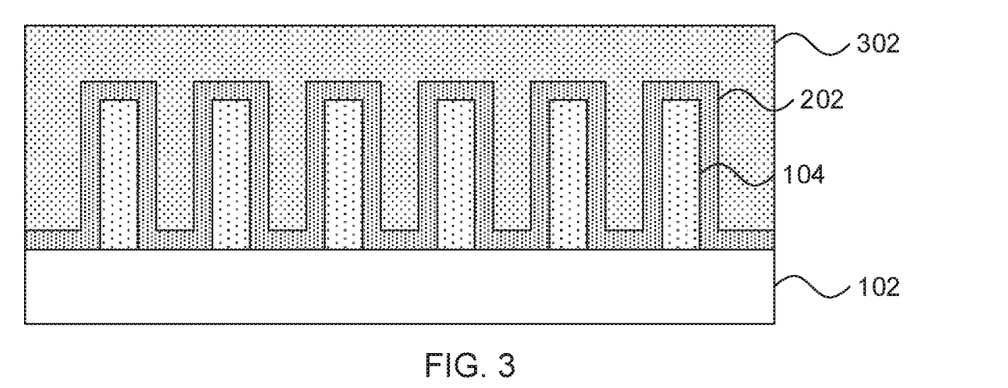
FIG. 3 is a cross-sectional diagram of a step in the formation of fin structures that shows the formation a second selectively etchable layer on the first selectively etchable layer in accordance with an embodiment of the present invention.

Referring now to FIG. 3, a cross-sectional view of a step in the formation of a set of semiconductor fins having sharp fin profiles is shown. An planarizing layer 302 is formed over the fins 104. It is specifically contemplated that the planarizing layer 302 may be formed from an organic planarizing material, referred to herein as an organic planarization layer. The planarizing layer 302 may, for example, be applied using spin coating technology or a flowable CVD process. In alternative embodiments, it should be understood that the planarizing layer 302 can be formed from any appropriate material having etch selectivity with respect to the protective layer 202 and the hardmask fins 104.

Figure 4:
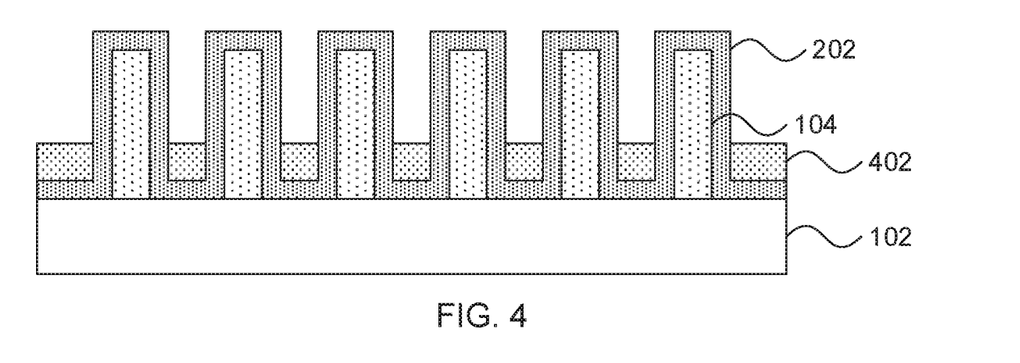
FIG. 4 is a cross-sectional diagram of a step in the formation of fin structures that shows etching back the second selectively etchable layer in accordance with an embodiment of the present invention.

Referring now to FIG. 4, a cross-sectional view of a step in the formation of a set of semiconductor fins having sharp fin profiles is shown. The planarizing layer 302 is partially etched back to form bottom spacers 402 at the base of the fins 104, establishing a first portion of the protective layer 202 that is covered and a second portion of the protective layer 202 that is exposed. The planarizing layer 302 can be etched back using any appropriately selective etching process, including a timed wet or dry chemical etch or an anisotropic etch, such as a selective RIE.

Figure 5:
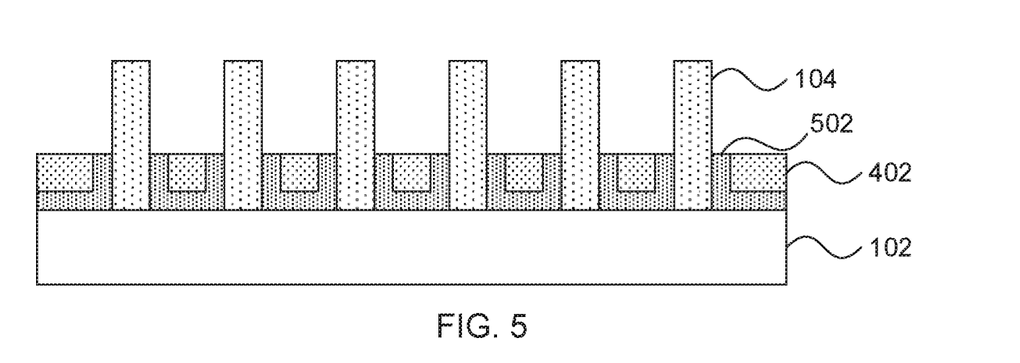
FIG. 5 is a cross-sectional diagram of a step in the formation of fin structures that shows etching back the first selectively etchable layer to a height of the second selectively etchable layer in accordance with an embodiment of the present invention.

Referring now to FIG. 5, a cross-sectional view of a step in the formation of a set of semiconductor fins having sharp fin profiles is shown. The exposed portion of the protective layer 202 is etched away using any appropriate isotropic etch that is selective to the material of the hardmask fins 104. The covered portion of the protective layer 202 remains, forming bottom protective layer 502.

Figure 6:
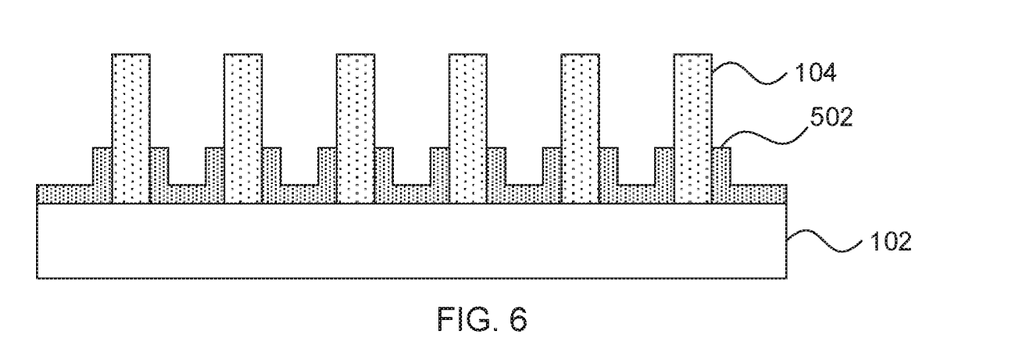
FIG. 6 is a cross-sectional diagram of a step in the formation of fin structures that shows etching away the second selectively etchable layer in accordance with an embodiment of the present invention.

Referring now to FIG. 6, a cross-sectional view of a step in the formation of a set of semiconductor fins having sharp fin profiles is shown. The bottom spacers 402 are etched away by any appropriate isotropic or anisotropic etch that is selective to the material of the fins 104 and the bottom protective layer 502, leaving horizontal surfaces of the bottom protective layer 502 exposed. The remaining organic planarizing material is removed because it has been exposed to multiple etches.

Figure 7:
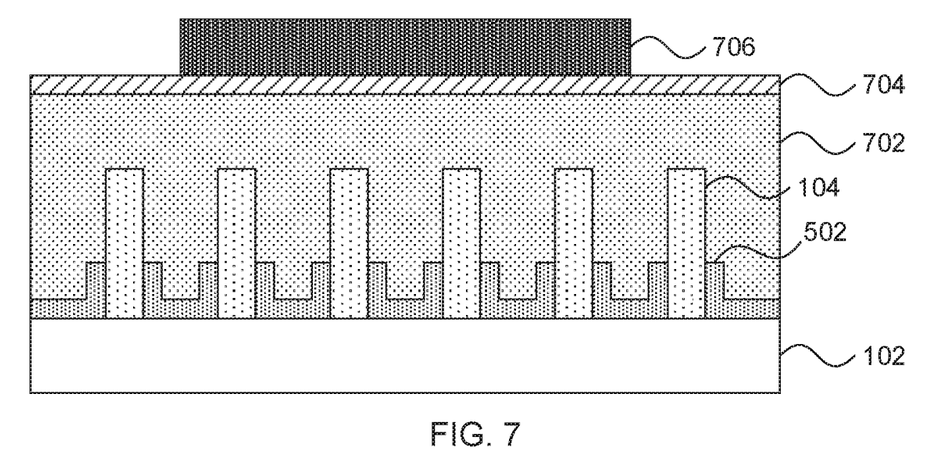
FIG. 7 is a cross-sectional diagram of a step in the formation of fin structures that shows forming a planarizing layer over the hardmask fins and masking the planarizing layer in accordance with an embodiment of the present invention.

Referring now to FIG. 7, a cross-sectional view of a step in the formation of a set of semiconductor fins having sharp fin profiles is shown. A layer of fin masking material 702 is deposited over the fins 104. An anti-reflective coating 704 is deposited over the layer of fin masking material 702. A pattern mask 706 is formed on the anti-reflective coating 704. It is specifically contemplated that the fin masking material 702 can be formed from an organic polymer and that the anti-reflective coating can be formed from a layer of silicon having a thickness that is appropriate to inhibit reflections from the underlying fin masking material 702. The pattern mask 706 is formed from any appropriate masking material that is opaque at wavelengths used to pattern the fin masking material 702.

Figure 8:
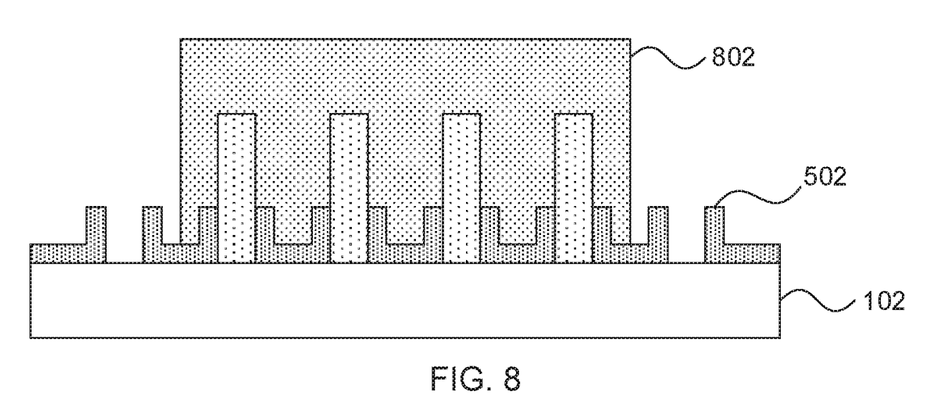
FIG. 8 is a cross-sectional diagram of a step in the formation of fin structures that shows patterning the planarizing layer using the mask and etching away exposed hardmask fin portions in accordance with an embodiment of the present invention.

Referring now to FIG. 8, a cross-sectional view of a step in the formation of a set of semiconductor fins having sharp fin profiles is shown. The pattern mask 706 is used as a mask to pattern the underlying fin masking material 702, causing the exposed material to be removed, leaving behind fin mask 802. Any exposed fins 104 or exposed portions of fins 104 can then be etched away using an anisotropic etch that is selective to the bottom protective layer 502 and layer 802, but that is not strongly selective to the material of the underlying semiconductor substrate.

In particular, it should be understood that some of the hardmask fins 104 are partially covered by the fin mask 802, with one or more ends of the hardmask fins 104 extending out of the fin mask 802. These exposed portions are etched away, and because of the etch used, are formed with sharp, vertical edges, without the sloping that can result from less aggressive etch chemistries.

In one particular embodiment, the exposed portion of the anti-reflective coating 704 is etched away using a plasma etch that includes $CF_4/CHF_3$. The exposed portion of the organic planarizing layer 702 is etched away using any appropriate etch including $CO_2/CO$, $N_2/H_2$, or $HBr/He/O_2$ etches, removing the resist 706 at the same time. The exposed portions of the hardmask fins 104 are then etched away, for example using a $CH_3F$ chemistry for silicon nitride structures or a $CF_4/CHF_3$ chemistry for silicon dioxide structures. Each etch chemistry is selected to have a minimum of damage to the underlying silicon layer 102.

Figure 9:
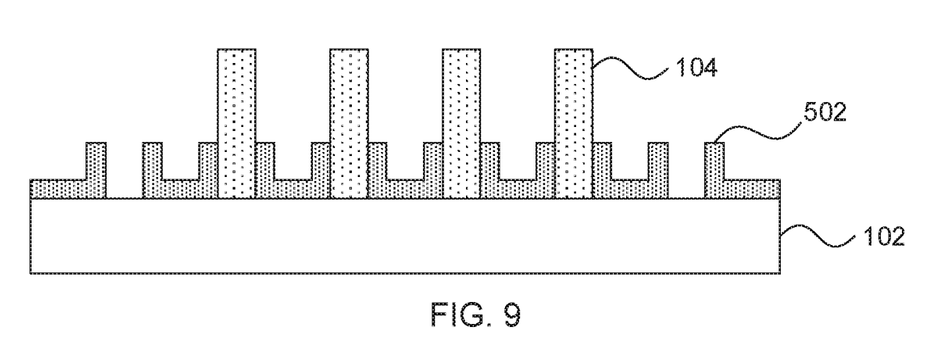
FIG. 9 is a cross-sectional diagram of a step in the formation of fin structures that shows etching away the planarizing layer in accordance with an embodiment of the present invention.

Referring now to FIG. 9, a cross-sectional view of a step in the formation of a set of semiconductor fins having sharp fin profiles is shown. The fin mask 802 is etched away using any appropriately selective etch chemistry such as $O_2$ or $N_2/H$ for example, exposing the remaining hardmask fins 104.

Figure 10:
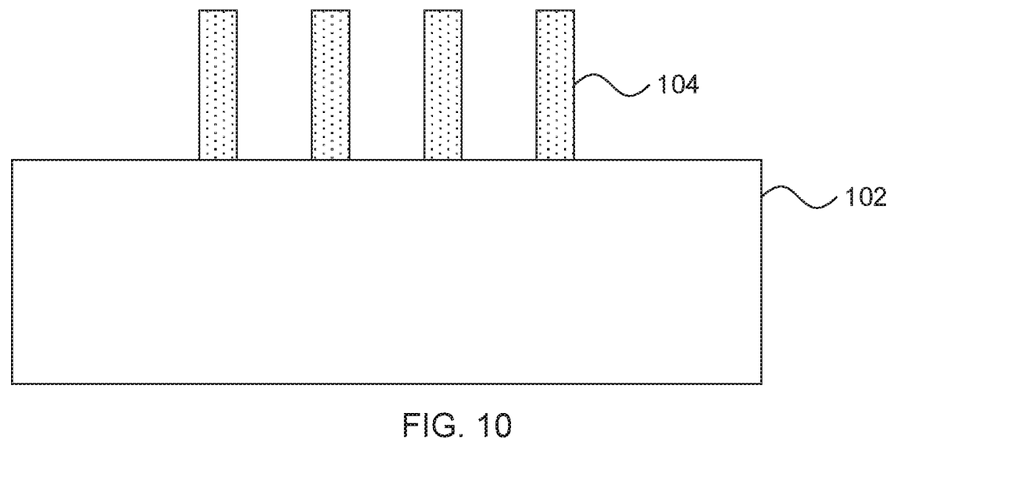
FIG. 10 is a cross-sectional diagram of a step in the formation of fin structures that shows etching away the first selectively etchable layer in accordance with an embodiment of the present invention.

Referring now to FIG. 10, a cross-sectional view of a step in the formation of a set of semiconductor fins having sharp fin profiles is shown. The bottom protective layer 502 is etched away using an appropriately selective etch chemistry, exposing the surface of the semiconductor layer 102. A greater thickness of the semiconductor layer 102 is shown in FIG. 10 to show the material from which semiconductor fins will be formed.

Figure 11:
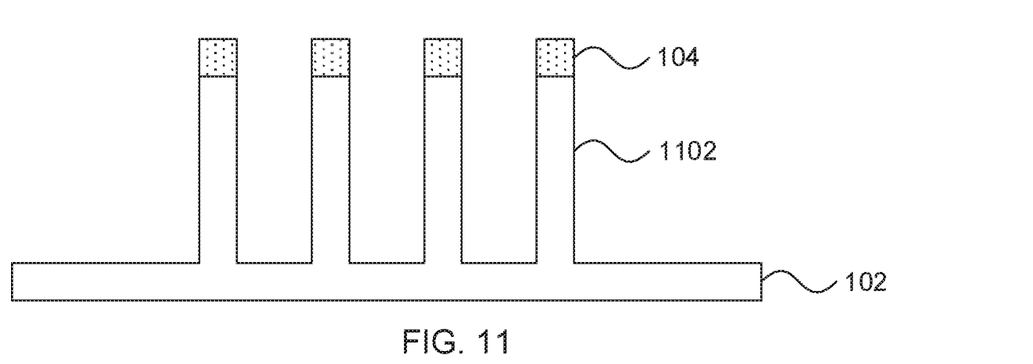
FIG. 11 is a cross-sectional diagram of a step in the formation of fin structures that shows etching fins into the semiconductor layer using the remaining portions of the hardmask fins as a mask in accordance with an embodiment of the present invention.

Referring now to FIG. 11, a cross-sectional view of a step in the formation of a set of semiconductor fins having sharp fin profiles is shown. The hardmask fins 104 are used as a mask to anisotropically etch down into the semiconductor layer 102 to form semiconductor fins 1102 using, e.g., RIE. The depth of the etch can be controlled by, e.g., timing the etch process according to a known rate of material removal.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching, and laser ablation.

At this point, the semiconductor fins 1102, along with any remaining portions of the hardmask fins 104, can be used to form any appropriate semiconductor device, such as a fin field effect transistor (finFET) or an electronically-triggered fuse. In the case of a finFET, portions of the semiconductor fins 1102 can be doped to form source and drain regions and a gate stack can be formed over a channel region of the semiconductor fins 1102. In the case of a fuse, a fuse region of the semiconductor fins 1102 can be made conductive by forming a silicide or similarly metallized region. The fuse region can then be broken by electromigration through the application of an appropriately high voltage.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other e rets or features. Thus, the term "below" can encompass both an ion of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 12:
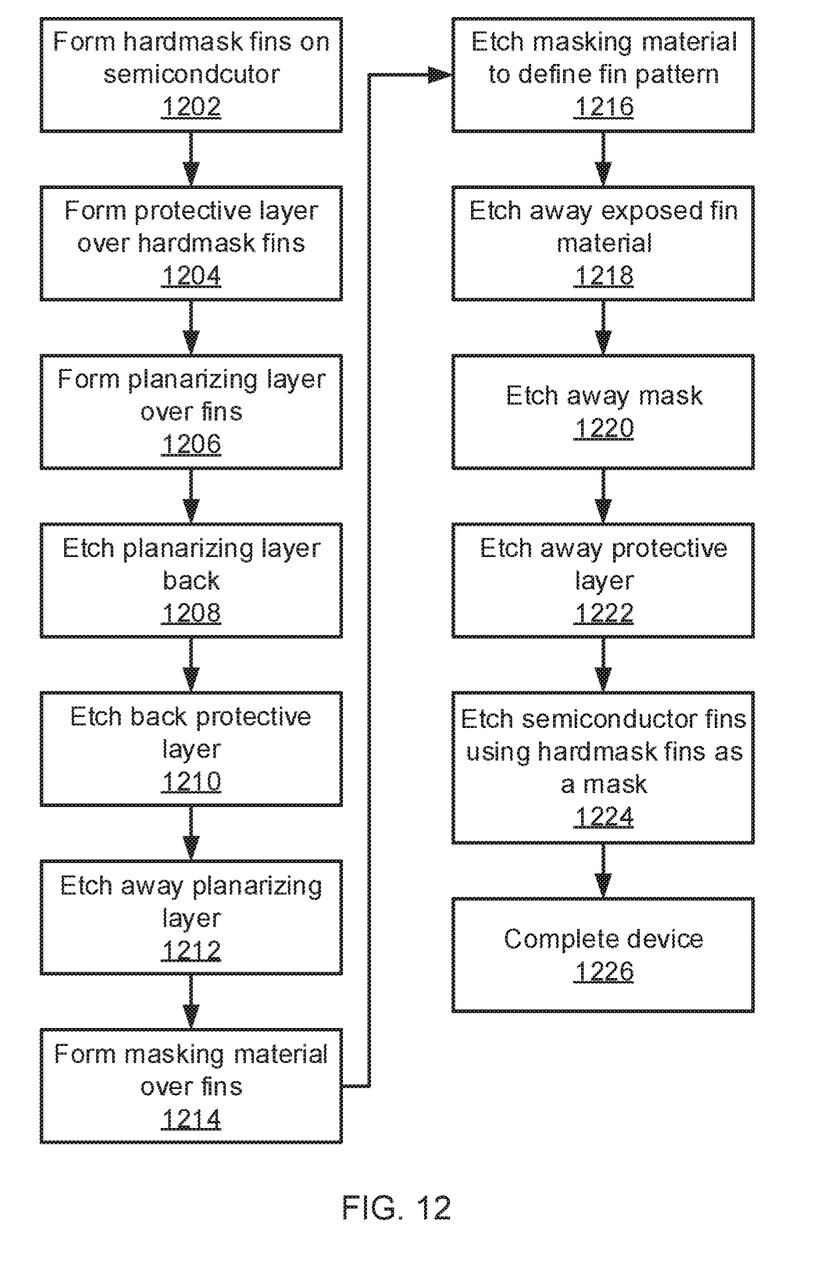
FIG. 12 is a block/flow diagram of a method for forming a semiconductor device in accordance with an embodiment of the present invention.

Referring now to FIG. 12, a block/flow diagram of a method for forming a fin-based semiconductor device is shown. Block 1202 forms hardmask fins 104 on a semiconductor layer 102. As noted above, the hardmask fins 104 can be formed from one or more layers of dielectric material that are anisotropically etched down to the underlying semiconductor layer 102. Block 104 forms protective layer 202 over the hardmask fins 104 by any appropriate conformal deposition process. It is specifically contemplated that the protective layer 202 can be formed from a hafnium oxide, but it should be understood that any material having appropriate etch selectivity with respect to the hardmask fins 104 and the semiconductor layer 102 can be used instead.

Block 1206 forms a planarizing layer 302 over the fins from, e.g., an organic planarizing layer. Block 1208 etches the planarizing layer 302 back to form bottom spacer 402 that leaves a portion of the protective layer 202 exposed. Block 1210 etches back the exposed portions of the protective layer 202, exposing top portions of the hardmask fins 104 and forming bottom protective layer 502. Block 1212 then etches away the bottom spacer 402, leaving exposed the horizontal surfaces of the bottom protective layer 502.

Block 1214 forms masking material 702 over the hardmask fins. Block 1216 etches the masking material 702 to define fin mask 702 according to a pattern that will establish the length and position of the eventual semiconductor fins. Block 1218 etches away portions of the hardmask fins 104 that are exposed by the fin mask 702, block 1220 etches away the fin mask 702, and block 1222 etches away the bottom protective layer 502.

Block 1224 etches the semiconductor fins 1102 from the semiconductor layer 102 using any appropriate anisotropic etch, with the hardmask fins 104 acting as an etch mask. Block 1226 completes the semiconductor device, forming such additional structures as are needed to fabricate, for example, an operational transistor or fuse.

Having described preferred embodiments of improved fin cut profiles using a fin base liner (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a semiconductor fin, comprising:
   forming a protective layer around a base of a hardmask fin on an underlying semiconductor layer;
   etching away a portion of the hardmask fin with an etch that is selective to the protective layer; and
   etching a semiconductor fin from the semiconductor layer using the etched hardmask fin as a mask.

2. The method of claim 1, wherein the protective layer is formed from a hafnium oxide.

3. The method of claim 1, wherein forming the protective layer comprises:
   forming a layer of protective material over the hardmask fin;
   forming a layer of planarizing material over the layer of protective material;
   etching back the layer of planarizing material to a height that covers a portion of the layer of protective material and leaves a remainder of the layer of protective material exposed;
   etching away the exposed protective material, leaving the protective layer; and
   etching away the remaining planarizing material.

4. The method of claim 3, wherein forming the layer of protective material comprises a conformal deposition process.

5. The method of claim 1, wherein the protective layer comprises a horizontal portion that is formed on a top surface of the underlying semiconductor layer around the hardmask fin and a vertical portion that is formed on sidewalls of the hardmask fin.

6. The method of claim 1, wherein etching away the portion of the hardmask fin comprises:
   forming a mask over the hardmask fin that leaves a portion of the hardmask fin exposed; and
   anisotropically etching away the exposed portion of the hardmask fin.

7. The method of claim 6, wherein anisotropically etching away the exposed portion of the hardmask fin comprises an etch chemistry selected from the group consisting of CF4/CHF3 and CH3F.

8. The method of claim 1, wherein etching the portion of the hardmask fin leaves a remaining portion of the hardmask fin with substantially vertical sidewalls.

9. The method of claim 1, further comprising forming a plurality of hardmask fins on the underlying semiconductor layer, wherein forming the protective layer around the base of the hardmask fin comprises forming the protective layer around the base of all of the plurality of hardmask fins.

10. The method of claim 9, wherein forming the protective layer around the base of the plurality of hardmask fins comprises forming the protective layer on the top surface of the underlying substrate layer between the plurality of hardmask fins.

11. A method for forming semiconductor fins, comprising:
forming a protective layer around a base of a plurality of hardmask fins on an underlying semiconductor layer and on a top surface of the underlying semiconductor layer, between the plurality of hardmask fins;
forming a mask over the hardmask fin that leaves a portion of the hardmask fin exposed;
anisotropically etching away the exposed portion of the hardmask fin with an etch that is selective to the protective layer, leaving a remaining portion of the hardmask fin with substantially vertical sidewalls;
etching away the mask; and
etching semiconductor fins from the semiconductor layer using the etched hardmask fins as a mask.

12. The method of claim 11, wherein the protective layer is formed from a hafnium oxide.

13. The method of claim 11, wherein forming the protective layer comprises:
forming a layer of protective material over the hardmask fins;
forming a layer of planarizing material over the layer of protective material;
etching back the layer of planarizing material to a height that covers a portion of the layer of protective material and leaves a remainder of the layer of protective material exposed;
etching away the exposed protective material, leaving the protective layer; and
etching away the remaining planarizing material.

14. The method of claim 13, wherein forming the layer of protective material comprises a conformal deposition process.

15. The method of claim 11, wherein the protective layer comprises a vertical portion that is formed on sidewalls of the plurality of hardmask fins.

16. The method of claim 11, wherein anisotropically etching away the exposed portion of the hardmask fin comprises an etch chemistry selected from the group consisting of CF4/CHF3 and CH3F.

17. A method for forming semiconductor fins, comprising:
forming a protective hafnium oxide layer around a base of a plurality of hardmask fins on an underlying semiconductor layer and on a top surface of the underlying semiconductor layer, between the plurality of hardmask fins, comprising a vertical portion on sidewalls of the plurality of hardmask fins;
forming a mask over the hardmask fin that leaves a portion of the hardmask fin exposed;
anisotropically etching away the exposed portion of the hardmask fin with an etch that is selective to the hafnium oxide layer, leaving a remaining portion of the hardmask fin with substantially vertical sidewalls;
etching away the mask; and
etching semiconductor fins from the semiconductor layer using the etched hardmask fins as a mask.

18. The method of claim 17, wherein forming the protective hafnium oxide layer comprises:
forming a layer of hafnium oxide over the hardmask fins;
forming a layer of planarizing material over the hafnium oxide layer;
etching back the layer of planarizing material to a height that covers a portion of the layer of hafnium oxide and leaves a remainder of the layer of hafnium oxide exposed;
etching away the exposed remainder of the hafnium oxide layer, leaving the covered portion of the hafnium oxide layer; and
etching away the remaining planarizing material.

19. The method of claim 18, wherein forming the layer of hafnium oxide material comprises a conformal deposition process.

20. The method of claim 17, wherein anisotropically etching away the exposed portion of the hardmask fin comprises an etch chemistry selected from the group consisting of CF4/CHF3 and CH3F.

* * * * *